(12) United States Patent
Ranjan et al.

(10) Patent No.: US 12,394,629 B2
(45) Date of Patent: Aug. 19, 2025

(54) PLASMA PROCESSING METHODS USING LOW FREQUENCY BIAS PULSES

(71) Applicant: Tokyo Electron Limited, Tokyo (JP)

(72) Inventors: Alok Ranjan, Austin, TX (US); Peter Ventzek, Austin, TX (US); Mitsunori Ohata, Taiwa-cho (JP)

(73) Assignee: Tokyo Electron Limited, Tokyo (JP)

( * ) Notice: Subject to any disclaimer, the term of this patent is extended or adjusted under 35 U.S.C. 154(b) by 874 days.

(21) Appl. No.: 17/483,346

(22) Filed: Sep. 23, 2021

(65) Prior Publication Data

US 2022/0028695 A1 Jan. 27, 2022

Related U.S. Application Data

(63) Continuation of application No. 16/785,260, filed on Feb. 7, 2020, now Pat. No. 11,158,516.

(51) Int. Cl.
*H01L 21/306* (2006.01)
*H01J 37/32* (2006.01)
(Continued)

(52) U.S. Cl.
CPC .... *H01L 21/3065* (2013.01); *H01J 37/32082* (2013.01); *H01J 37/321* (2013.01);
(Continued)

(58) Field of Classification Search
CPC ........... H01L 21/3065; H01L 21/32136; H01L 21/67069; H01L 21/6833; H01J 37/32082;
(Continued)

(56) References Cited

U.S. PATENT DOCUMENTS 6,129,806 A 10/2000 Kaji et al.
8,569,176 B2 10/2013 Nakagawa et al.
(Continued)

FOREIGN PATENT DOCUMENTS

CN 103594352 A 2/2014
EP 1953797 A2 8/2008
(Continued)

OTHER PUBLICATIONS

TW Office Action: Notification of Examination Opinions, Taiwanese Patent Application No. 110104182, Nov. 5, 2024, 18 pages.
(Continued)

*Primary Examiner* — Yuechuan Yu
(74) *Attorney, Agent, or Firm* — Slater Matsil, LLP

(57) ABSTRACT

A plasma processing apparatus includes a processing chamber, a source power coupling element configured to generate plasma in the processing chamber, and a source power supply node coupled to the source power coupling element and configured to supply radio frequency power to the source power coupling element. The plasma processing apparatus further includes a substrate holder disposed in the processing chamber, a first bias power supply node coupled to the substrate holder and configured to supply first direct current biased power to the substrate holder, and a second bias power supply node coupled to the substrate holder and configured to supply second direct current biased power to the substrate holder. The first direct current biased power includes a first bias power frequency less than about 800 kHz and the second direct current biased power includes a second bias power frequency greater than about 800 kHz.

20 Claims, 8 Drawing Sheets

(51) Int. Cl.
*H01L 21/3065* (2006.01)
*H01L 21/3213* (2006.01)
*H01L 21/67* (2006.01)
*H01L 21/683* (2006.01)

(52) U.S. Cl.
CPC .. *H01J 37/32128* (2013.01); *H01J 37/32146* (2013.01); *H01J 37/32165* (2013.01); *H01J 37/32697* (2013.01); *H01J 37/32715* (2013.01); *H01L 21/32136* (2013.01); *H01L 21/67069* (2013.01); *H01L 21/6833* (2013.01); *H01J 2237/3341* (2013.01)

(58) Field of Classification Search
CPC ............... H01J 37/321; H01J 37/32128; H01J 37/32146; H01J 37/32165; H01J 37/32697; H01J 37/32715; H01J 2237/3341
See application file for complete search history.

(56) References Cited

U.S. PATENT DOCUMENTS

| | | | |
|---|---|---|---|
| 9,788,405 | B2 | 10/2017 | Kawasaki et al. |
| 2006/0175015 | A1* | 8/2006 | Chen .................. H01J 37/321 156/345.44 |
| 2011/0139748 | A1 | 6/2011 | Donnelly et al. |
| 2013/0168354 | A1 | 7/2013 | Kanarik |
| 2015/0072530 | A1 | 3/2015 | Kim et al. |
| 2016/0212833 | A1 | 7/2016 | Zhao et al. |
| 2017/0098527 | A1 | 4/2017 | Kawasaki et al. |
| 2017/0186586 | A1 | 6/2017 | Oh et al. |
| 2017/0358428 | A1 | 12/2017 | Kawasaki et al. |
| 2018/0047573 | A1 | 2/2018 | Tanaka et al. |
| 2018/0261430 | A1 | 9/2018 | Kawasaki |
| 2019/0157043 | A1* | 5/2019 | Shaw ................ H01J 37/32477 |

FOREIGN PATENT DOCUMENTS

| | | |
|---|---|---|
| JP | 2008263226 | 10/2008 |
| KR | 1020140041651 A | 4/2014 |
| KR | 20170075887 A | 7/2017 |
| KR | 20180052778 A | 5/2018 |
| TW | 201722213 A | 6/2017 |

OTHER PUBLICATIONS

PCT International Search Report and Written Opinion, PCT Application No. PCT/US2020/060837, Mar. 9, 2021, 10 pages.

Sirse, Nishant, et al., "Electron density modulation in a pulsed dual-frequency (2/13.56 MHZ) dual-antenna inductively coupled plasma discharge," Journal of Vacuum Science & Technology A, 34(5), Jul. 28, 2016, 10 pages.

Wakayama, Go et al., "Study on the Dual Frequency Capacitively Coupled Plasmas by the Particle-in-Cell/Monte Carlo Method," IEEE Transactions on Plasma Science, vol. 31, No. 4, Aug. 2003, 7 pages.

Korean Office Action Translation, Patent Application No. 10-2022-7030208, Jan. 6, 2025, 11 pages.

* cited by examiner

PLASMA PROCESSING METHODS USING LOW FREQUENCY BIAS PULSES

CROSS-REFERENCE TO RELATED APPLICATIONS

This application is a continuation application of U.S. application Ser. No. 16/785,260, filed on Feb. 7, 2020, which application is hereby incorporated herein by reference in its entirety.

TECHNICAL FIELD

The present invention relates generally to plasma processing, and, in particular embodiments, to plasma processing methods, apparatuses, and systems using lower frequency biases pulses.

BACKGROUND

Device formation within microelectronic workpieces can involve a series of manufacturing techniques including formation, patterning, and removal of a number of layers of material on a substrate. In order to achieve the physical and electrical specifications of current and next generation semiconductor devices, processing flows enabling reduction of feature size while maintaining structural integrity is desirable for various patterning processes. As device structures densify and develop vertically, the desire for precision material processing becomes more compelling.

Plasma processes are commonly used to form devices, interconnects, and contacts in microelectronic workpieces. Plasma processes are used at a variety of processing stages such as front-end-of-line (FEOL), middle-of-line (MOL), and back-end-of-line (BEOL). For example, plasma etching and plasma deposition are common process steps during semiconductor device fabrication. A combination of source power (SP) applied to a coupling element and bias power (BP) applied to a substrate holder can be used to generate and direct plasma. SP can be used to generate the plasma which increases the plasma temperature. Similarly, BP can be used to impart velocity to plasma species. However, conventional plasma processes struggle to decouple these effects from one another resulting in reduced control and precision of the processes. Therefore, plasma processing methods that decouple the effects of SP and BP may be desirable.

SUMMARY

In accordance with an embodiment of the invention, a plasma processing method includes providing a first SP pulse to an SP coupling element for a first SP pulse duration to generate plasma in a processing chamber, providing a high frequency BP pulse to a substrate holder disposed in the processing chamber for a high frequency BP pulse duration overlapping the first SP pulse duration, and providing a first low frequency BP pulse to the substrate holder for a first low frequency BP pulse duration not overlapping the first SP pulse duration. The high frequency BP pulse includes a high frequency BP pulse frequency that is greater than 800 kHz. The first low frequency BP pulse includes a low frequency BP pulse frequency that is less than about 800 kHz.

In accordance with another embodiment of the invention, a plasma processing method includes providing a first SP pulse to an SP coupling element for a first SP pulse duration to generate plasma in a processing chamber and providing a plurality of BP pulses to a substrate holder disposed in the processing chamber during a first BP pulse duration not overlapping the first SP pulse duration. Each of the plurality of BP pulses including a BP pulse frequency less than about 800 kHz and a BP pulse duration less than about 10 µs.

In accordance with still another embodiment of the invention, a plasma processing apparatus, includes a processing chamber, an SP coupling element configured to generate plasma in the processing chamber, an SP power supply node coupled to the SP coupling element and configured to supply radio frequency (RF) power to the SP coupling element, and a substrate holder disposed in the processing chamber. The plasma processing apparatus further includes a first BP supply node coupled to the substrate holder and configured to supply first direct current biased power to the substrate holder and a second BP supply node coupled to the substrate holder and configured to supply second direct current biased power to the substrate holder. The first direct current biased power includes a first BP frequency less than about 800 kHz. The second direct current biased power includes a second BP frequency greater than 800 kHz.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
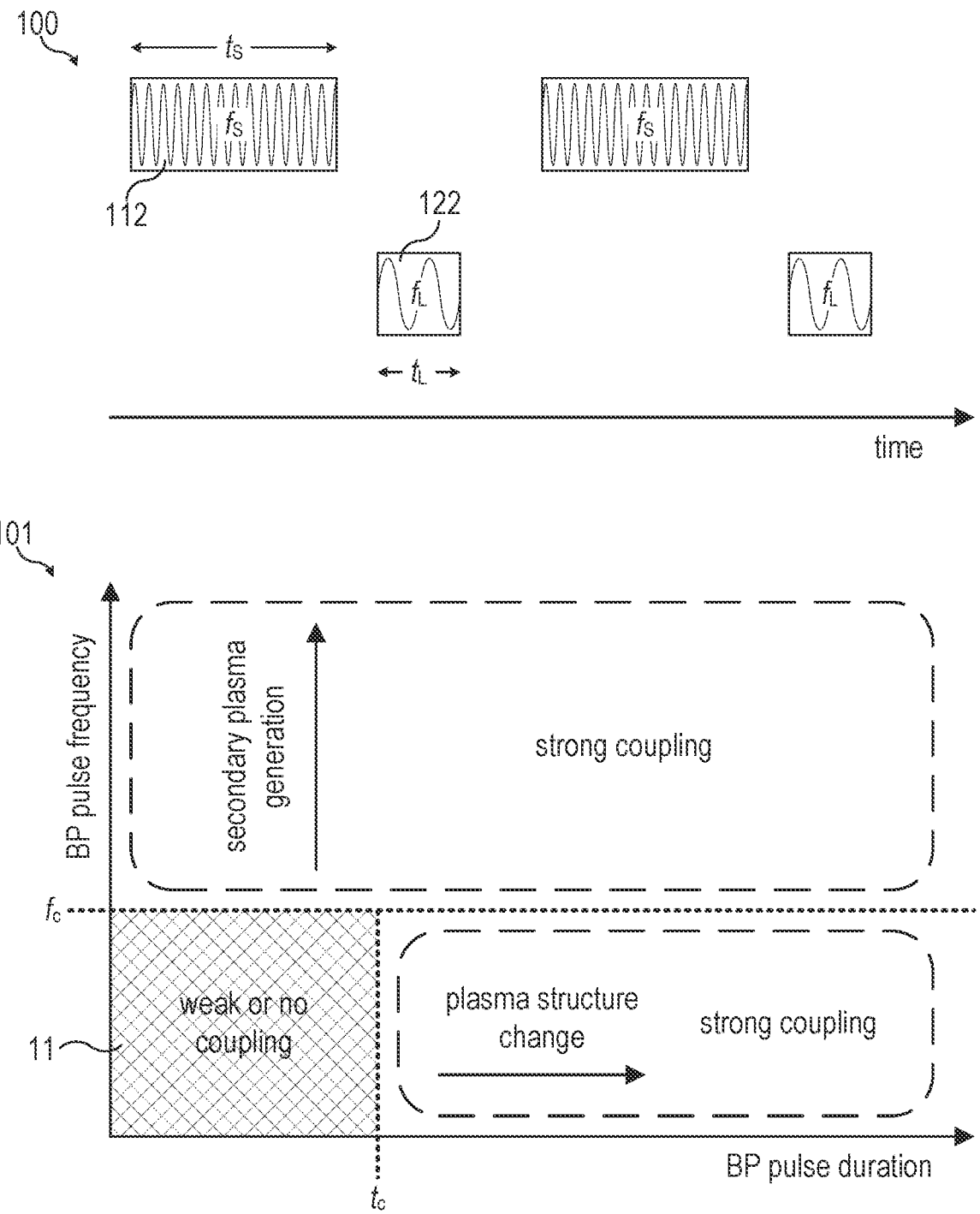
FIG. 1 illustrates a schematic timing diagram of an example plasma processing method and a corresponding qualitative graph of the impact of BP pulse frequency and BP pulse duration on coupling in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Control of plasma characteristics may be important when implementing plasma processing methods (e.g. plasma etching and plasma deposition). Additional control may be gained from utilizing pulsing techniques to provide source power and bias power to a processing chamber with appropriate timing. A technique that includes SP pulses and/or BP pulses may sometimes be referred to as an advance pulsing technique (APT). An APT may be implemented using one or more waveform generators and controllers to control the shape and timing of the applied power.

In particular, for example, an APT may be implemented as a cyclic sequence of pulses including two or more loosely define phases. An SP pulse may be applied to a coupling element (e.g. coils of a helical resonator) to generate a high-density plasma containing ions and radicals during a first phase (e.g. an SP phase or a plasma generation phase). One or more BP pulses may be applied to a substrate holder to couple energy to ions and direct them toward a substrate supported by a substrate holder during a second phase (e.g. a BP phase or an ion acceleration phase). A third phase may be utilized in which the SP and/or BP are off to allow control of by-products within the processing chamber (e.g. an off phase or by-product management phase).

SP may be supplied as alternating current (AC) power in the radio frequency (RF) range (e.g. high frequency (HF), very high frequency (VHF), and others). BP may be supplied as direct current (DC) power (e.g. continuous DC power, pulsed DC power, bipolar DC power, etc.) or AC power (e.g. HF, medium frequency (MF), low frequency (LF), very low frequency (VLF), etc.).

Conventional plasma processing methods apply both SP and BP in the HF range. However, the energy imparted to ions in the plasma by the BP pulses may be minimal despite the absence of SP during the BP phase. Even for BP frequencies at 2 MHz (i.e. MF range), the bulk of the ions reaching the substrate surface may be near thermal (i.e. with negligible vertical velocity/large ion angle). For example, BP frequencies above about 645 kHz may raise the electron temperature $T_e$ of the plasma and result in parasitic plasma generation during the BP phase. Parasitic plasma generation may contribute to the lack of ion verticality because large bias voltages and large sheaths may result in most of the ion energy being lost to collisions.

When applying BP pulses to a substrate holder, the SP coupling element (e.g. an inductive coil) may function as a low frequency return for the power coupled to the substrate through the substrate holder. Lower frequency BP pulses may change the structure of the plasma compared to higher frequency BP pulses. Small amounts of LF power in the coil may sensitively impact the plasma. For example, as the BP is increased, the plasma density (e.g. $n_e$) may increase while the rise-time and the fall-time of $n_e$ both decrease. Additionally as the SP is increased relative to the BP, the rise-time and the fall-time may decrease while $n_e$ is substantially unaffected.

Due to the sensitivity of the plasma characteristics to the application of BP, a broad range of conditions can generate parasitic plasma and destroy decoupling between the plasma generation and the ion acceleration. As the BP is increased the ion energy (i.e. ion temperature) may be undesirably increased as well resulting in the ion density distribution growing toward the substrate until parasitic plasma is generated at the substrate surface. As a specific example, in a system including an argon (Ar) plasma with chlorine (e.g. $Cl_2$) additives, parasitic plasma can be generated with a BP voltage of 500 V at 800 kHz.

In various embodiments, plasma processing methods described herein include providing SP and BP to a processing chamber at differing frequencies. For example, SP pulses may be applied to an SP coupling element to generate plasma in the processing chamber and lower frequency BP (LBP) pulses may be applied to a substrate holder. The LBP pulses may have a frequency less than about 800 kHz, for example. Optionally, higher frequency BP (HBP) pulses may also be applied. For example, the HBP pulses may have a frequency greater than 800 kHz, such as about 13 MHz, for example. Each of the LBP pulses may optionally be applied as a plurality of BP pulses of short duration provided after an SP pulse. For example, the duration of each of the plurality of BP pulses may be less than about 10 μs, for example.

The embodiment plasma processing methods may advantageously decouple plasma generation from applied BP. For example, the SP and BP may beneficially be decoupled enhancing control and decreasing complexity. In other words, cross-talk between the source and bias may by reduced or eliminated. The plasma processing methods described herein may also advantageously result in substantially vertical ion velocity $V_\perp$ (i.e. perpendicular to the substrate surface/small ion angle), little to no plasma heating (e.g. $T_e$) or generation, and little to no ion heating (i.e. small horizontal/parallel velocity $V_\parallel$. Thus, ion verticality may be beneficially maintained throughout the BP phase.

A further advantage may be generation of plasma with cold bulk ions resulting in high density, high pressure, and a thin sheath. Advantageously, little or no plasma generation may occur from applied BP in the plasma processing methods described herein. BP pulses with frequencies below a certain critical frequency threshold may advantageously extract large ion flux at the substrate.

Embodiments provided below describe various plasma processing methods and systems and apparatuses for performing the plasma processing methods, and in particular, plasma processing methods that include LBP pulses. The following description describes the embodiments. An example schematic timing diagram of an embodiment plasma processing method is described using FIG. 1. Two example schematic timing diagrams of embodiment plasma processing methods that include HBP pulses are described using FIGS. 2 and 3. Several additional schematic timing diagrams of embodiment plasma processing methods are described using FIGS. 4 and 5. FIG. 6 is used to describe an example plasma processing system including an example plasma processing apparatus. Two example plasma processing methods are described using FIGS. 7 and 8.

FIG. 1 illustrates a schematic timing diagram of an example plasma processing method and a corresponding qualitative graph of the impact of BP pulse frequency and BP pulse duration on coupling in accordance with an embodiment of the invention.

Referring to FIG. 1, a schematic timing diagram boo shows the application of SP and BP in a plasma processing system. At least one SP pulse 112 and at least one LBP pulse 122 are provided to the plasma processing system. In various embodiments the SP is AC power and is RF power in some embodiments. Accordingly, each SP pulse 112 has an SP pulse frequency $f_S$ indicating the frequency of the applied power. For example, the SP pulse frequency $f_S$ may be in the HF range, the VHF range, and others. In one embodiment, the SP pulse frequency $f_S$ is about 26 MHz. In another embodiment, the SP pulse frequency $f_S$ is about 13 MHz.

Similarly, the BP may be AC power (e.g. DC biased) or DC power. Each LBP pulse 122 has an LBP pulse frequency $f_L$ that is less than about 800 kHz. The LBP pulse frequency $f_L$ may be in the MF range, the LF range, the VLF range, and lower. For example, the LBP pulse frequency $f_L$ may be zero corresponding to continuous wave (CW) DC power. Additionally, BP delivered as DC power may be bipolar to counteract charging effects at a substrate. In some embodiments, the LBP pulse frequency $f_L$ is less than about 645 kHz, and is about 400 kHz in one embodiment. There are no anticipated limitations on the SP pulse frequency $f_S$ relative to the LBP pulse frequency $f_L$.

Each SP pulse 112 has an SP pulse duration $t_S$ while each LBP pulse 122 has an LBP pulse duration $t_L$ indicating the duration of each type of pulse. As shown, the SP pulse duration $t_S$ and the LBP pulse duration $t_L$ do not overlap in time. In various embodiments, the LBP pulse duration $t_L$ is less than about 100 µs and is about 80 µs in one embodiment. There is no required relationship between the SP pulse duration $t_S$ and the LBP pulse duration $t_L$. In other words, LBP pulse duration $t_L$ may be greater than, equal to, or less than the SP pulse duration $t_S$ depending on the specific details of a given plasma process.

The combination of appropriate timing between SP pulses and LBP pulses and the lower frequency of the LBP pulses may advantageously decouple the effects of the applied SP from the effects of the applied BP. For example, the impact of BP on plasma generation may be reduced or eliminated in an optimal region 11 as shown in in the qualitative graph 101 of BP pulse frequency versus BP pulse duration.

The optimal region 11 corresponds to sufficiently low values of BP pulse frequency and BP pulse duration. In particular, above a certain critical BP pulse frequency $f_C$, strong coupling may exist resulting in undesirable secondary plasma generation. For example, once 13.56 MHz BP is applied, a secondary plasma may be generated above the wafer which may change the radical-to-ion ratio thereby changing the degree of passivation of sidewalls and/or changing selectivity, among other effects. Although the specific value of the critical BP pulse frequency $f_C$ may depend on a variety of factors, the critical BP pulse frequency $f_C$ may be about 645 kHz. For example, a BP pulse (e.g. an impulse bias) provided as DC power at 645 kHz may provide no supplemental plasma generation and no perturbation to a plasma generated by a previous SP pulse or the corresponding afterglow.

Similarly, BP pulse duration above a certain critical BP pulse duration $t_C$ may form strong coupling that results in undesirable plasma structure changes. For example, a possible disadvantage of a longer duration is that the plasma may begin to be depleted which alters the structure of the plasma. The specific value of the critical BP pulse duration $t_C$ may also depend on several factors and may be between about 25 µs and about 300 µs, for example. One factor that may affect the specific value of $t_C$ is the rate that the BP changes the electron temperature $T_e$. Slower increases in $T_e$ by the BP may result in larger values of $t_C$.

Accordingly, LBP pulses having an LBP pulse frequency $f_L$ less than the critical BP pulse frequency $f_C$ and an LBP pulse duration $t_L$ less than the critical BP pulse duration $t_C$ are applied in order to remain in the optimal region 11 and avoid strong coupling scenarios. For example, in some cases an LBP pulse frequency $f_L$ of about 400 kHz is a desirable frequency as it may decouple well from plasma generation or increasing the electron temperature $T_e$. However, although not required, HBP pulses may also be appropriately utilized in conjunction with the LBP pulses while still maintaining weak or no coupling as described in the following.

Figure 2:
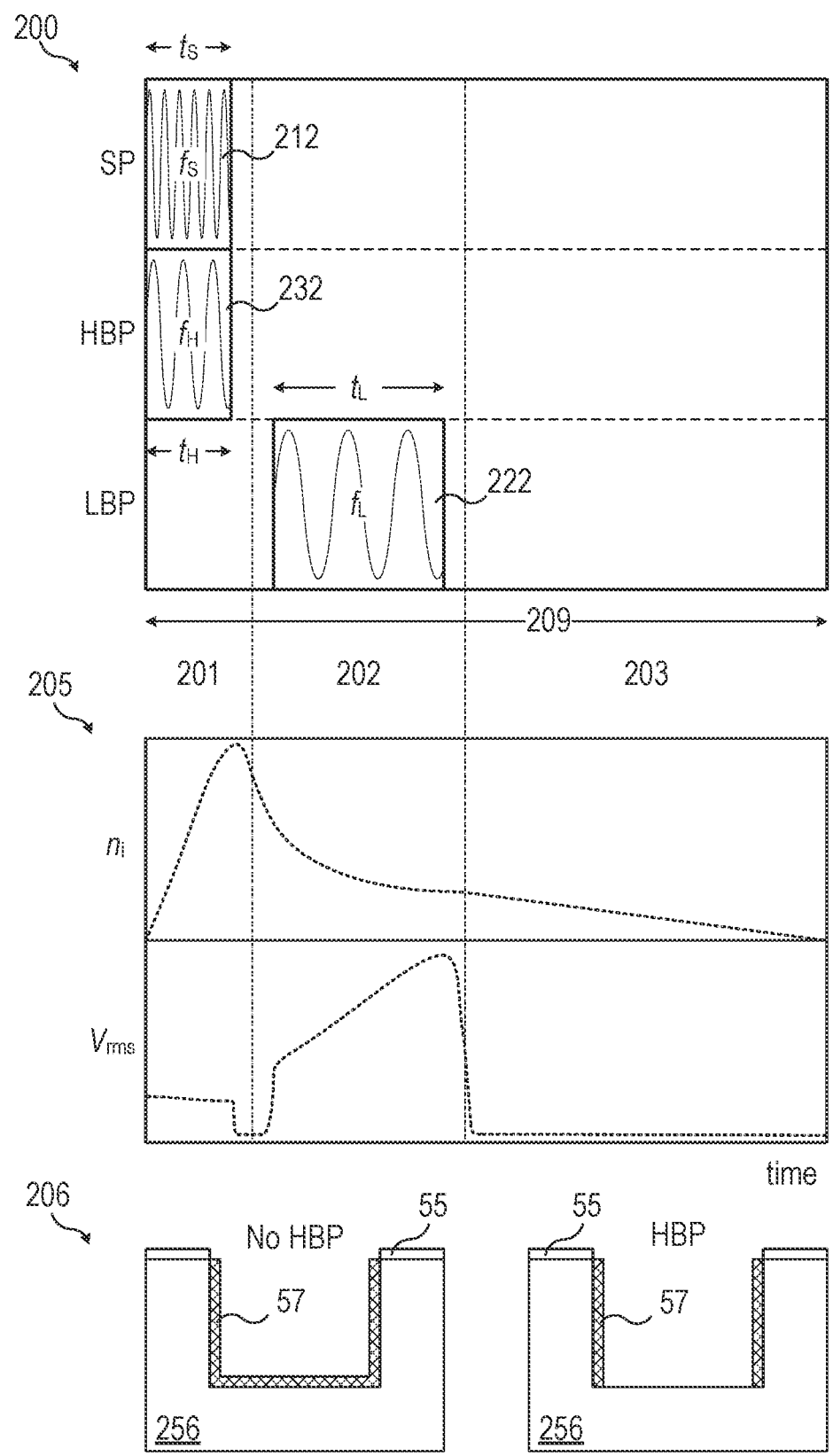
FIG. 2 illustrates a schematic timing diagram of another example plasma processing method, a corresponding qualitative graph of ion density and potential at a substrate, and a schematic diagram of a possible effect of a higher frequency BP pulse at the substrate in accordance with an embodiment of the invention.

FIG. 2 illustrates a schematic timing diagram of another example plasma processing method, a corresponding qualitative graph of ion density and potential at a substrate, and a schematic diagram of a possible effect of an HBP pulse at the substrate in accordance with an embodiment of the invention. The schematic timing diagram of FIG. 2 may be a specific implementation of other schematic timing diagrams described herein such as the schematic timing diagram of FIG. 1, for example. Similarly labeled elements may be as previously described.

Referring to FIG. 2, a schematic timing diagram 200 shows the application of SP and BP in a plasma processing system. An SP pulse 212 with SP pulse frequency $f_S$ and SP pulse duration $t_S$ and an LBP pulse 222 with LBP pulse frequency $f_L$ and LBP pulse duration $t_L$ are provided to the plasma processing system during a pulse cycle 209 which may be repeated as needed. Specifically, the pulse cycle 209 may be cyclically performed a number of times in order to perform a given embodiment plasma processing method. The pulse cycle 209 may have any suitable duration and is about 1 ms in one embodiment.

The pulse cycle 209 may be conceptually divided into a number of phases such as three phases as shown. The SP pulse 212 is applied to the plasma processing system during phase 201 while the LBP pulse 222 is applied during phase 202. Phase 201 may be referred to as an SP phase or plasma generation phase. Phase 202 may be referred to as a BP phase or an ion acceleration phase. Optionally, as shown, a phase 203 may also be included during which the SP and BP are off. Phase 203 may be referred to as an off phase or by-product management phase.

Additionally, an HPB pulse 232 is also provided during phase 201. The HBP pulse 232 has an HPB pulse frequency $f_H$ and HPB pulse duration $t_H$. As shown, the HBP pulse duration $t_H$ coincides with the SP pulse duration $t_S$ in one embodiment. Alternatively, the HBP pulse duration $t_H$ may be different than the SP pulse duration $t_S$. Additionally or alternatively, the HBP pulse 232 may also be applied during other phases as described in the following. For example, the HBP pulse 232 can also be applied during phase 202. The HPB pulse frequency $f_H$ is greater than the LBP pulse frequency $f_L$. For example, in various embodiments, $f_L$ is less than about 800 kHz while $f_H$ is greater than 800 kHz. In some embodiments, $f_H$ is in the HF range and is about 13.56 MHz in one embodiment.

The pulses may have an effect of the ion density $n_i$ and the root-mean-squared potential $V_{rms}$ at the substrate. For example, as shown in qualitative graph 205, the ion density $n_i$ increases during the SP pulse 212 in phase 201. Since the LBP pulse 222 is decoupled from the generated plasma, the ion density $n_i$ decreases during phase 202 which may correspond with the afterglow. In contrast, the potential $V_{rms}$ at the substrate is relatively low and constant in phase 201, but increases in phase 202 with the application of the LBP pulse 222. Following the afterglow, the ion density $n_i$ continues to gradually decrease while the potential $V_{rms}$ drops off rapidly to near zero during phase 203 in the absence of applied power.

The pulse timing shown in schematic timing diagram 200 may advantageously be used in a number of plasma processing methods (e.g. for logic fabrication) such as thin etching, profile etching, (e.g. managing thin-top, bottom-corner rounding) and patterning (e.g. silicon nitride, silicon oxide, silicon), as well as multiple patterning uses.

HBP pulses may be desirable for changing the radical generation rate (e.g. Cl) and/or impacting the etching profile. HPB pulses may also be advantageously used to manage cleanliness of a given plasma process (e.g. during SP application in antiphased processes). For example, passivation of horizontal surfaces may be controlled using HPB pulses. Referring now to schematic diagram 206, a mask 55 may delineate etching regions of a substrate 256 including features such as trenches and holes with sidewalls. It may be desirable to reduce or prevent etching of the sidewalls by forming a passivation layer 57. The passivation layer 57 is an oxide in some embodiments. Oxide may be beneficial for sidewall protection, but may decrease the etch rate and pose an etch stopping risk when forming on horizontal surfaces. As shown in the schematic diagram 206, an HBP pulse 232 during phase 201 can reduce or prevent the passivation layer 57 from forming on horizontal surfaces of the substrate 256 which may advantageously help manage the etch front.

The HBP pulse 232 is off in phase 202 while the LBP pulse 222 is on. Different BP frequencies may be beneficial at different phases of a given plasma process. For example, in some cases, providing pure lower frequency BP during a bias phase may be advantageous to facilitate increased decoupling. However, the HBP pulse 232 may also extend into and through both phase 202 and phase 203. Similarly, providing higher frequency BP during a source phase may advantageously control surface interactions at a substrate surface (e.g. by inhibiting oxide formation on horizontal surfaces such as the bottom of features. For example, applying HBP along with SP may maintain a potential (plasma potential $V_{PP}$ and DC potential $V_{DC}$) while LBP (e.g. 400 kHz) maximizes $V_{PP}$ in the afterglow. As discussed above, HBP pulses may also be omitted (e.g. in cases where control of the potential at the substrate during a source phase is less important).

One specific implementation of the plasma processing method shown using schematic timing diagram 200 may be a silicon (Si) etch using a 50:50 HBr and Ar gas mixture with $CF_4$ and $O_2$ additives. In this specific example, the SP pulse 212 may be applied with an SP pulse power $P_S$ of about 500 W, with is being about 20 μs and $f_S$ being in the HF range (e.g. 13.56 MHz, 26 MHz, etc.). The HBP pulse 232 may be applied with an HBP pulse power $P_H$ of about 100 W at the same time and for the same duration as the SP pulse 212 ($t_H$=20 μs) with $f_H$ being about 13.56 MHz. The LBP pulse 222 may be applied with an LBP pulse power $P_L$ of about 500 W for a longer duration ($t_L$=80 μs) with $f_L$ being about 400 kHz. The phase 203 may be implemented as an off phase to control by-products and may have a duration of about 900 μs. Therefore, in this specific example, the duration of the pulse cycle 209 may be about 1 ms.

Figure 3:
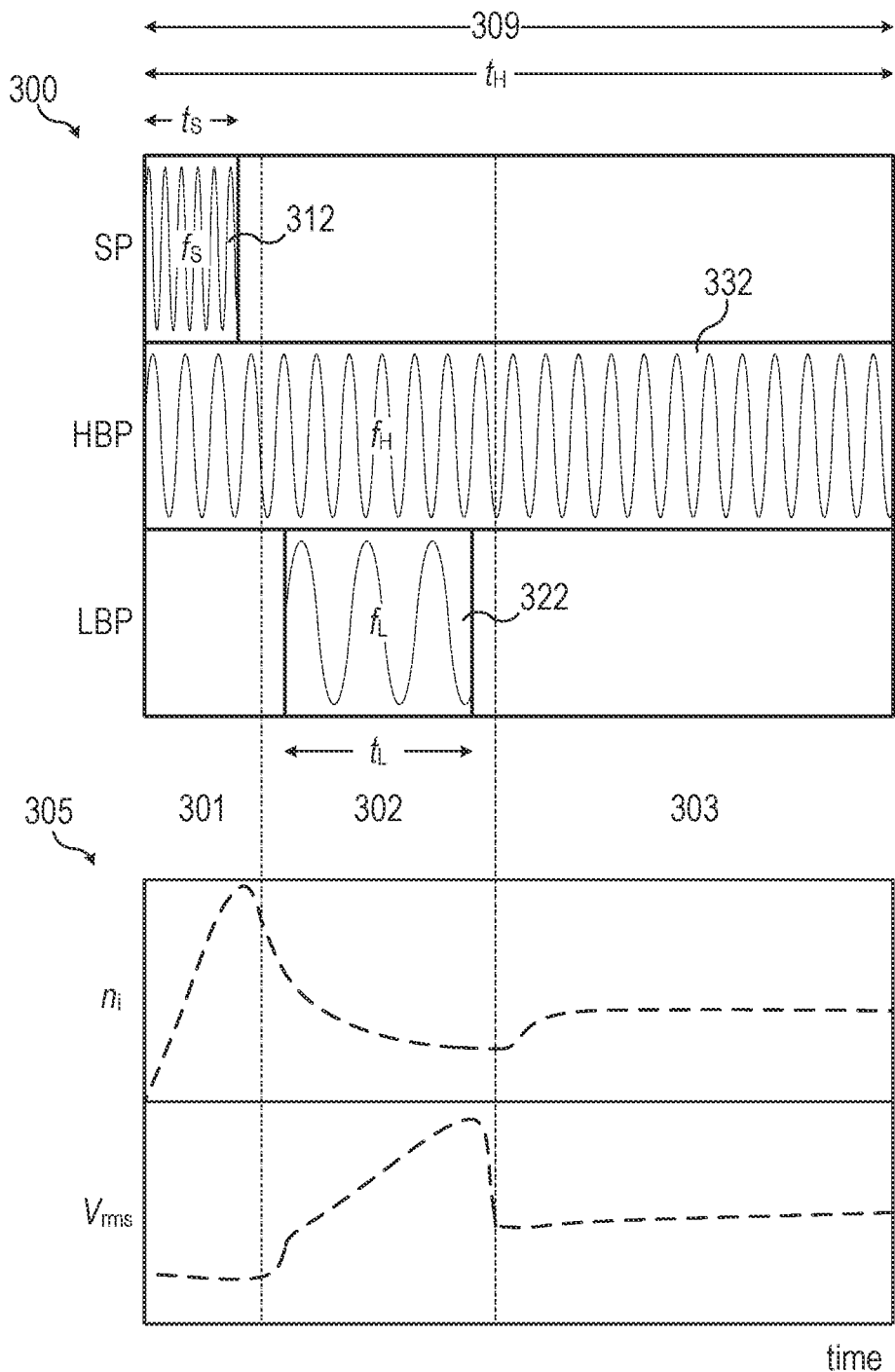
FIG. 3 illustrates a schematic timing diagram of yet another example plasma processing method and a corresponding qualitative graph of ion density and potential at a substrate in accordance with an embodiment of the invention.

FIG. 3 illustrates a schematic timing diagram of yet another example plasma processing method and a corresponding qualitative graph of ion density and potential at a substrate in accordance with an embodiment of the invention. The schematic timing diagram of FIG. 3 may be a specific implementation of other schematic timing diagrams described herein such as the schematic timing diagram of FIG. 1, for example. Similarly labeled elements may be as previously described.

Referring to FIG. 3, a schematic timing diagram 300 shows the application of SP and BP in a plasma processing system. An SP pulse 312, an HBP pulse 332, and an LBP pulse 322 are provided to the plasma processing system during a pulse cycle 309 which may be repeated as needed. Different from the schematic timing diagram 200 of FIG. 2, the HBP pulse duration $t_H$ is equal to the duration of the pulse cycle 309 in the schematic timing diagram 300. This application of HBP may be low power and relate to the maintenance of plasma ignition. For example, for cases where an ignition issue may exist (e.g. low pressure, long off phase, etc.) low power HBP may be desirable to maintain a small amount of plasma to facilitate reliable re-ignition of the plasma during the subsequent source phase.

A qualitative graph 305 shows the effect of the extended duration of the HBP pulse 332 on the ion density $n_i$ and the potential $V_{rms}$ at the substrate. As shown, $n_i$ and $V_{rms}$ behave similarly in phase 301 and phase 302 as in corresponding phase 201 and phase 202 of FIG. 2. However, in phase 303, both $n_i$ and $V_{rms}$ are held at relatively constant nonzero values by the HBP pulse 332. Compared to phase 203 of FIG. 2 where both $n_i$ and $V_{rms}$ may be negligible, the ion density $n_i$ may be kept at a desirable level by the HBP pulse 332 in phase 303 corresponding to low density plasma. This "tickle" plasma may advantageously enable easier ignition immediately following phase 303.

Additionally, it should be noted that in this case the HBP pulse 332 is maintained through phase 302 which may increase the ion flux in this phase. However, the HBP could also be turned off during phase 302 in some cases. The viability of maintaining an HBP pulse during phase 302 may depend on the impact of by-product redeposition for a given process.

Figure 4:
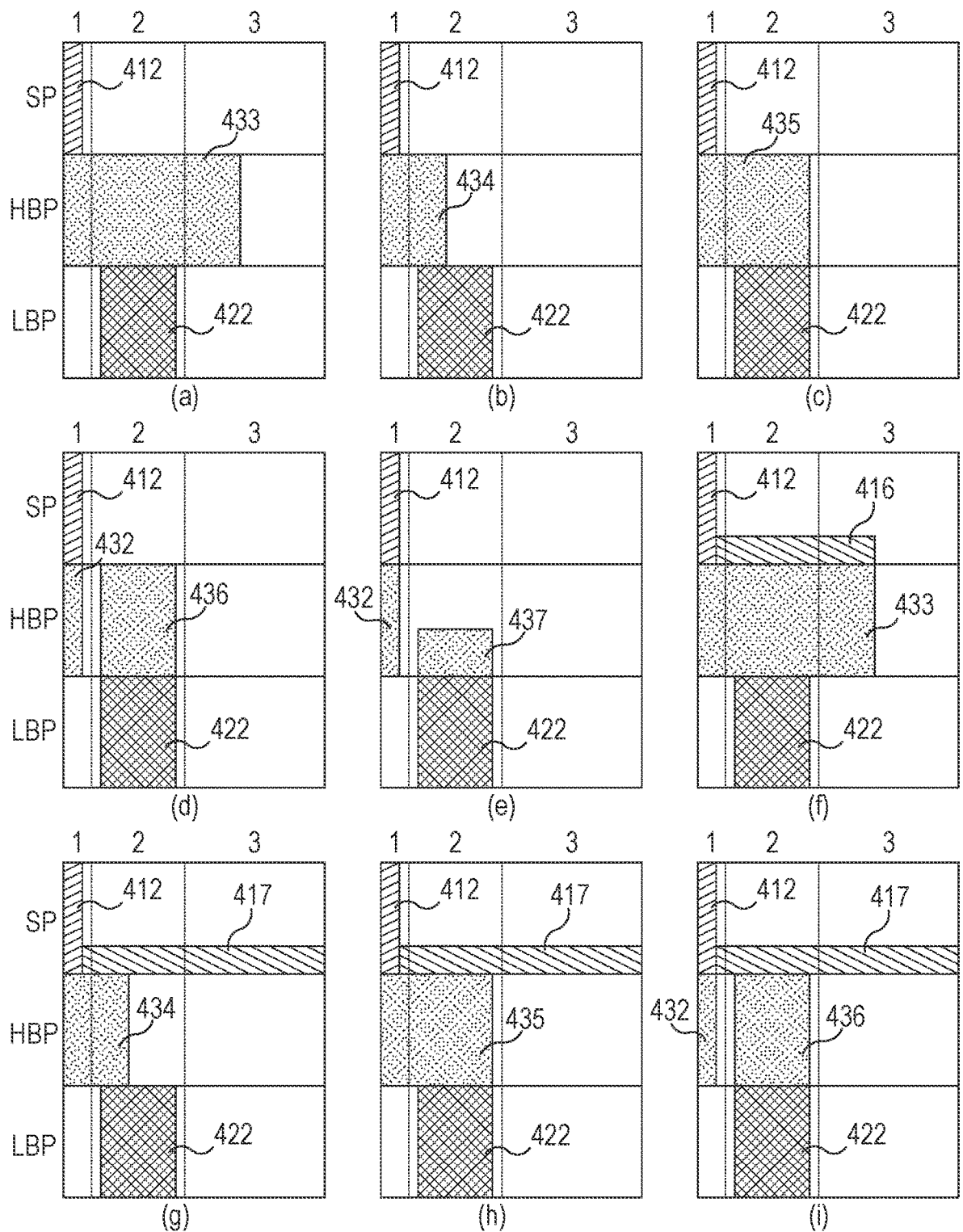
FIG. 4 illustrates schematic timing diagrams of various plasma processing methods in accordance with embodiments of the invention.

FIG. 4 illustrates schematic timing diagrams of various plasma processing methods in accordance with embodiments of the invention. The schematic timing diagrams of FIG. 4 may be specific implementations of other schematic timing diagrams described herein such as the schematic timing diagram of FIG. 1, for example. Similarly labeled elements may be as previously described.

Referring to FIG. 4, several schematic timing diagrams show a nonexhaustive sampling of scenarios for the timing and power of SP, HBP, and LBP for various plasma processing methods. Each of the diagrams (a)-(i) include at least one SP pulse 412 and an LBP pulse 422 and are conceptually divided into three phases (phase 1, phase 2, and phase 3). The diagrams differ from one another in that various HBP pulses and additional SP pulses may also be included having various durations and timing.

Diagram (a) depicts a scenario similar to that of FIG. 3 except that an HBP pulse 433 is applied with a duration extending through phase 1 and phase 2 and partially through phase 3. Diagrams (b) and (c) depict two alternative scenarios where an HBP pulse 434 extends only partially through phase 2 and where an HBP pulse 435 is applied with a duration that terminates simultaneously with the LBP pulse 422. In these and other scenarios, HBP pulses may be used primarily for maintaining ignition and not for imparting energy (i.e. acceleration) to ions.

In the same way, diagram (d) depicts a similar scenario to that of FIG. 2 with an HBP pulse 432 applied simultaneously with the SP pulse 412, but also with an additional HBP pulse 436 applied simultaneously with the LBP pulse 422. Therefore the timing scenario depicted in diagram (d) is similar to that of diagram (c) except with an interval with the HBP off between the SP pulse 412 and the LBP pulse 422. In diagram (d) the HBP pulse 432 and additional HBP pulse 436 are shown as having the same power. However, this is not necessarily the case. For example, a lower power HBP pulse 437 may be supplied during the LBP pulse 422 as shown in diagram (e).

Diagram (f) depicts a scenario similar to that of diagram (a) with a low power SP pulse 416. For example, the SP pulse 412 may have a first SP pulse power $P_{S1}$ of about 500 W while the low power SP pulse 416 may have a second SP pulse power $P_{S2}$ of about 100 W. Any relationship between $P_{S1}$ and $P_{S2}$ may be used and may depend on the specific requirements of a given plasma processing method. For example, the lower power of $P_{S2}$ relative to $P_{S1}$ may be used to provide a small amount of extra plasma. Further, a continuous low power SP pulse 417 may also be applied through both phase 2 and phase 3 as shown in diagrams (g), (h), and (i). When the SP is on in phase 3 it may lower the ion density and increase the ion flux, which may also be desirable in some cases.

It should be noted that a delay may exist in practice between the SP pulse 412 and the low power SP pulse 416 although there may also not be any delay as shown. For example, the delay may be about 5 μs or may be any other value. Factors such as frequency and duty cycle of the applied SP may influence the value of the delay between the SP pulse 412 and subsequent SP pulses (i.e. low power SP pulse 416, continuous low power SP pulse 417).

While a wide variety of timing scenarios have been depicted in FIG. 4, any suitable combination of any of these and other embodiments described herein may be made while including at least one SP pulse and at least one LBP pulse in order to meet specific needs of a particular application of the invention. Although shown as such, there is no requirement that HBP pulses begin simultaneously with an SP pulse or an LBP pulse. In other words, the beginning of any of the HBP pulses shown may be offset in time relative to SP pulses or LBP pulses in an analogous manner to offset timing of the end of the HBP pulse shown in FIG. 4.

Figure 5:
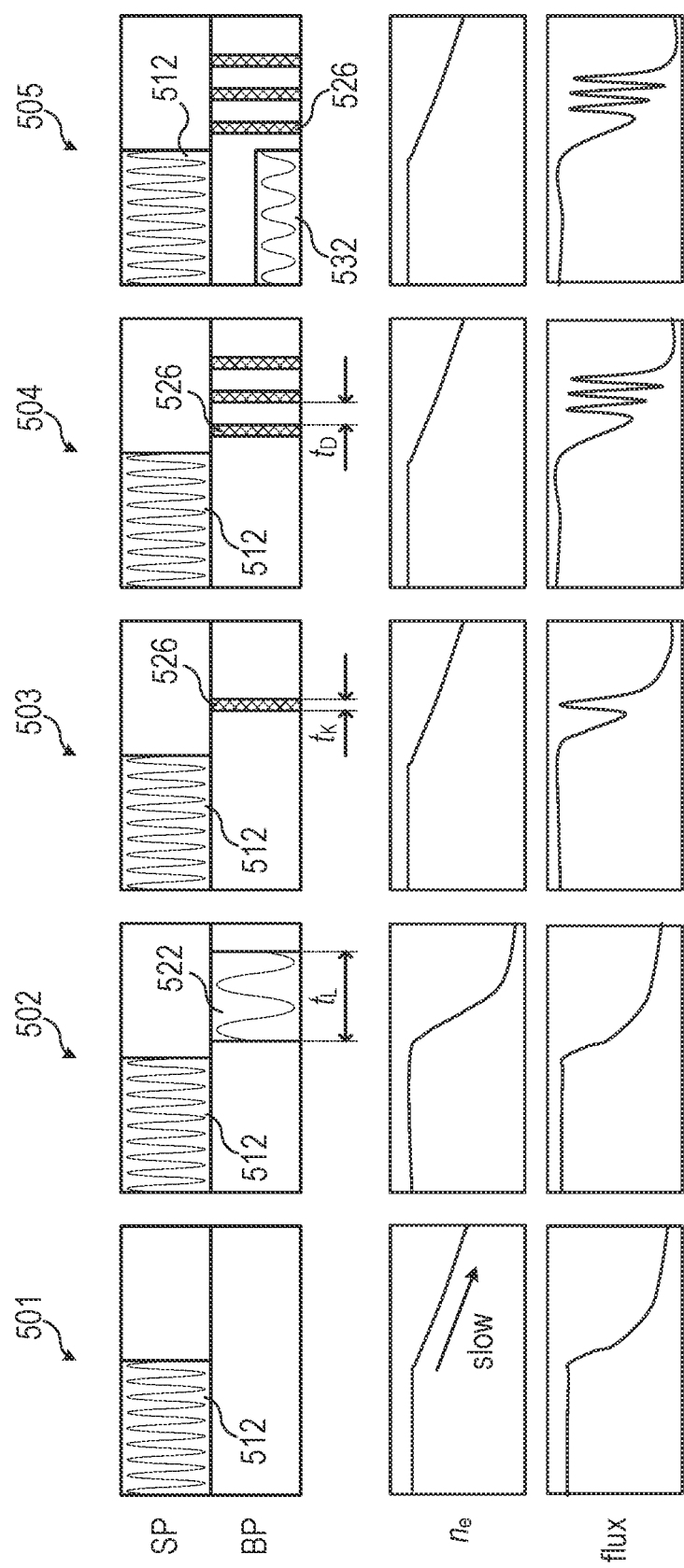
FIG. 5 illustrates schematic timing diagrams of several plasma processing methods and corresponding qualitative graphs of electron density and ion flux in accordance with embodiments of the invention.
Figure 6:
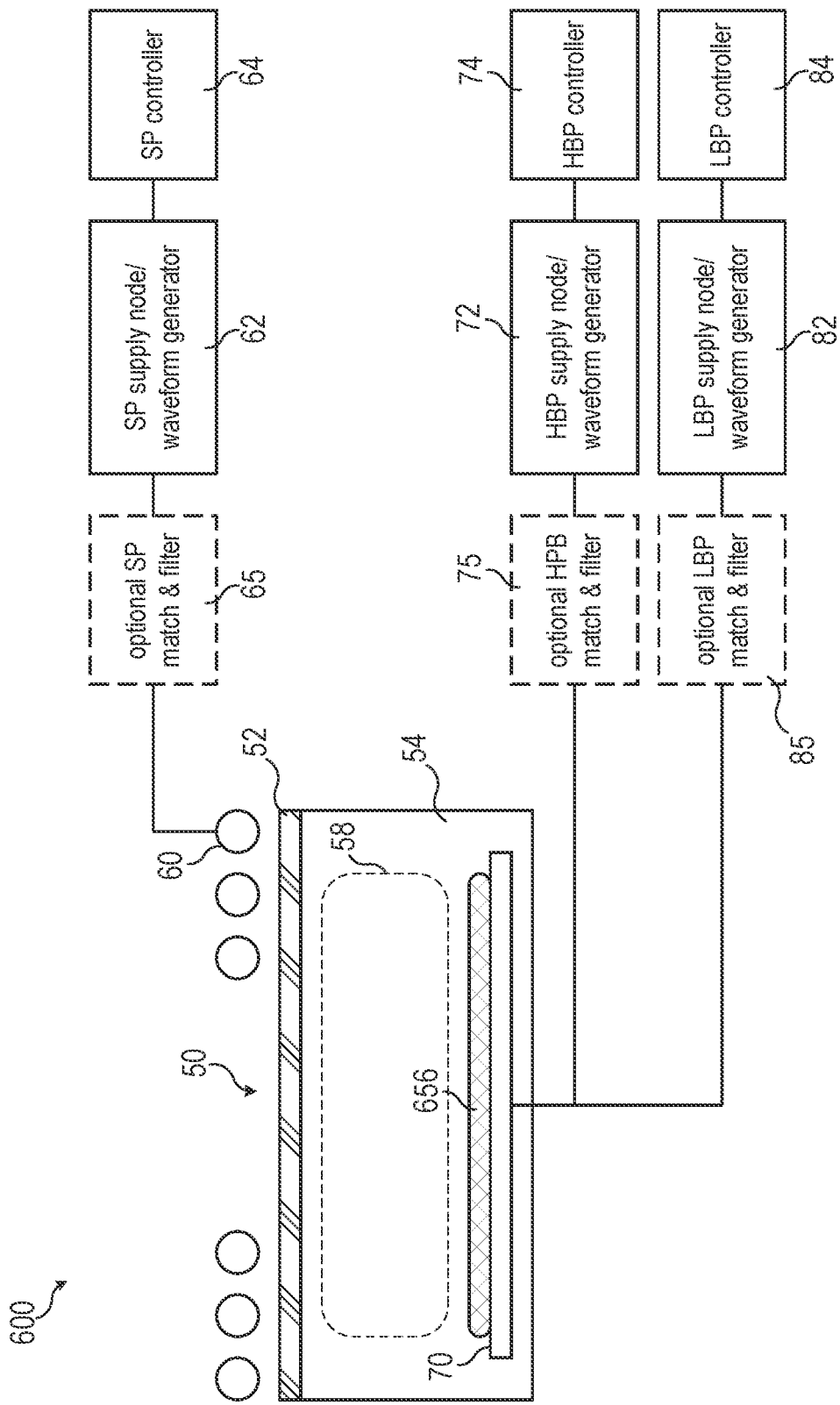
FIG. 6 illustrates a schematic block diagram of an example plasma processing system in accordance with an embodiment of the invention.

FIG. 5 illustrates schematic timing diagrams of several plasma processing methods and corresponding qualitative graphs of electron density and ion flux in accordance with embodiments of the invention. The schematic timing diagrams of FIG. 5 may be specific implementations of other schematic timing diagrams described herein such as the schematic timing diagram of FIG. 1, for example. Similarly labeled elements may be as previously described.

Referring to FIG. 5, schematic timing diagram 501 depicts the application on an SP pulse 512 without applying BP. The corresponding qualitative graph of electron density $n_e$ and ion flux shows that $n_e$ and the ion flux are high during the SP pulse 512 and then decrease after the SP is terminated. The ion flux decreases rapidly while $n_e$ decreases at a gradual substantially constant rate. The introduction of an LBP pulse 522 with LBP pulse duration $t_L$ after the SP pulse 512 may change the rate that $n_e$ decreases as shown in schematic timing diagram 502. In particular, the LBP pulse 522 with a sufficiently long $t_L$ may perturb the plasma such that it is depleted faster. For example, the ion flux may mirror the background plasma density. However, it may be desirable to generate more ion flux (e.g. dose) before applying another SP pulse.

For example, a sufficiently short LBP pulse may affect the ion flux without strongly perturbing the background plasma. In other words, impulse bias extracts flux, but does not perturb the afterglow. This can be seen in schematic timing diagram 503 which shows that a sufficiently short LBP pulse (i.e. an LBP spike 526) generates a corresponding sharp peak in the ion flux while $n_e$ is unaffected. As shown, the LBP spike 526 has an LBP spike duration $t_K$ that is sufficiently short so as to have minimal or no effect on the background plasma (i.e. $n_e$) while increasing the ion flux. In various embodiments, $t_K$ is less than 20 μs and is less than 10 μs in some embodiments. In one embodiment, $t_K$ is about 10 μs. In another embodiment, $t_K$ is about 1 μs.

The LBP spike 526 may be similar to LBP pulses as previously described, but with shorter duration (i.e. $t_K$). For example, the LBP spike 526 may be BP applied with a frequency less than about 645 kHz (e.g. 400 kHz). Additionally and also similar to previously described LBP pulses, the LBP spike 526 may also be CW DC power. For example, in one embodiment, the LBP spike 526 is an application of CW DC power with about a 10 μs LBP spike duration $t_K$. In other embodiments, the CW DC power may be applied for longer or shorter durations.

Long LBP pulses may result in parasitic plasma generation and/or plasma structure changes as previously described. However, parasitic plasma generation may increase more gradually for BP "pulse trains." Therefore, as shown in schematic timing diagram 504, multiple appropriately spaced LBP spikes 526 may advantageously generate a relatively a constant ion flux without depleting the afterglow. For example, trains of dose at energies (e.g. that gradually increase with the declining background density) may advantageously result in more monoenergetic beams.

The spacing $t_D$ between adjacent LBP spikes 526 may depend on various factors such as the frequency of the applied BP and length of $t_K$ among others. However, $t_D$ may be chosen such that perturbation of the background plasma is avoided (e.g. short enough not to elevate the electron temperature $T_e$). For example, $t_D$ is larger than $t_K$ in various embodiments. In some embodiments, $t_D$ is between about 20 μs and about 100 μs. In other embodiments, $t_D$ is between about 10 μs and about 50 μs.

In some cases, surface charging may be an issue when applying LBP pulses and/or LBP spikes (e.g. for dielectric substrates, etc.). The magnitude of charging effects may depend on the materials included in a given substrate and charge may be sufficiently dissipated between LBP spikes in some cases. However, it may be desirable to counteract undesirable charging effects by using bipolar DC power for the LBP spikes 526 in other cases. For example, every other LBP spike may be positive or other patterns may be used such as ----+++, --+, etc. Additionally, the duration of positive LBP spikes may be different from the duration of negative LBP spikes. Further, although three LBP spikes 526 are shown, there is no intended limitation on the number of LBP spikes 526. The number of LBP spikes 526 per cycle may depended on the pulse cycle time, dosage requirements, and other considerations specific to a given application.

In addition to multiple LBP spikes 526, an HBP pulse 532 may also be incorporated in order to facilitate chemistry control while the SP is on as shown in schematic timing diagram 505. As shown, the ion flux during the SP pulse 512 may be minimally impacted by the potential introduced by the HBP pulse 532. This scenario may combine the advantages of HBP power previously described with the advantages of LBP spikes. It should be noted that LBP spikes may be incorporated in any of the timing configurations as described. In other words, the scope of the invention is intended to include LBP spikes as an optional implementation for any LBP pulse described herein.

FIG. 6 illustrates a schematic block diagram of an example plasma processing system in accordance with an embodiment of the invention. The plasma processing system and plasma processing apparatus of FIG. 6 may be used to implement any of the schematic timing diagrams to perform the embodiment plasma processing methods described herein, such as the schematic timing diagrams of FIGS. 1-5, for example. Furthermore, the plasma processing system and plasma processing apparatus of FIG. 6 may be used to perform any of the embodiment methods as described herein, such as the plasma processing methods of FIGS. 7 and 8, for example.

Referring to FIG. 6, a plasma processing system 600 includes a plasma processing apparatus 50 that includes an SP coupling element 60 (e.g. an inductive coil, helical resonator, etc.) coupled to a processing chamber 54. Although shown as an inductive coil located outside a quartz window 52 of the plasma processing apparatus 50, the SP coupling element 60 may also be implemented as a conductive plate inside the processing chamber 54 as well as any other suitable configuration (e.g. antenna, electrode, waveguide, electron beam, etc.). The SP coupling element 60 is configured to couple SP to the processing chamber 54 so that plasma 58 is generated inside the processing chamber 54. The plasma 58 may be any type of plasma such as an inductively coupled plasma (ICP), capacitively coupled plasma (CCP), surface wave plasma (SWP), and others.

A substrate holder 70 (e.g. an electrostatic chuck) is disposed within the processing chamber 54. The substrate holder 70 is configured to support a substrate 65. The substrate holder 70 is further configured to couple BP to the processing chamber 54. The coupled BP may include both HBP and LBP as described herein.

The SP may be provided to the processing chamber 54 using an SP control path that includes an SP supply node 62 coupled to the SP coupling element 60 and an SP controller 64. The SP supply node 62 may also be coupled to or include a waveform generator. Additionally, the SP supply node 62 and the SP controller 64 may also be combined. An optional SP matching stage 65 may also be included between the SP coupling element 60 and the SP supply node 62.

Similarly, HBP and LBP may be provided to the processing chamber 54 using separate or combine BP control paths that include an HBP supply node 72 and an LBP supply node 82 coupled to the substrate holder 70 as well as to an HBP controller 74 and an LBP controller 84 as shown. As with the SP, one or both of the HBP supply node 72 and the LBP supply node 82 may also be coupled to or include a respective waveform generator. Also as before, an optional HBP matching stage 75 and/or an optional LBP matching stage 85 may be included between the substrate holder 70 and the corresponding supply node. In some cases (e.g. for bipolar DC LBP pulses/spikes) the LBP supply node 82 may be split into a positive LBP power supply and a negative LBP power supply.

The controllers (i.e. SP controller 64, HBP controller 74, LBP controller 84) are configured to control the timing of pulses during cyclic plasma processes. The relative timing is fully customizable as previously described. Each of the SP pulses, HBP pulses, and the LBP pulses can be in phase, partially overlapping, or antiphased relative to each other.

Figure 7:
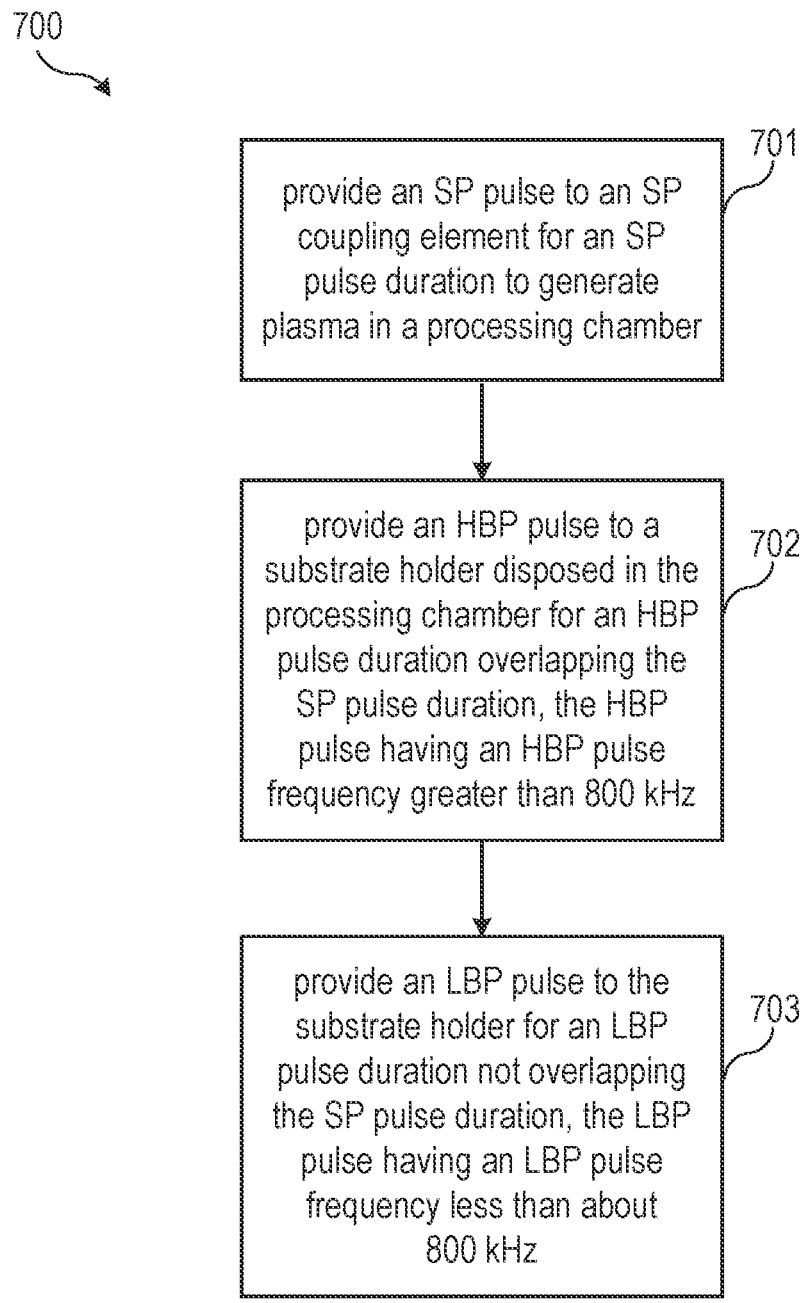
FIG. 7 illustrates an example plasma processing method in accordance with an embodiment of the invention.

FIG. 7 illustrates an example plasma processing method in accordance with an embodiment of the invention. The plasma processing method of FIG. 7 may be performed using embodiment schematic timing diagrams and embodiment plasma processing systems and apparatuses as described herein. For example, the plasma processing method of FIG. 7 may be combined with any of the embodiments of FIGS. 1-6. The below method steps may be performed in any suitable order as may be apparent to a person of skill in the art.

Referring to FIG. 7, step 701 of a plasma processing method 700 includes providing an SP pulse to an SP coupling element for an SP pulse duration to generate plasma in a processing chamber. Step 702 includes providing an HBP pulse to a substrate holder disposed in the processing chamber for an HBP pulse duration overlapping the SP pulse duration. The HBP pulse has an HBP pulse frequency greater than 800 kHz. Step 703 includes providing an LBP pulse to the substrate holder for an LBP pulse duration not overlapping the SP pulse duration. The LBP pulse has an LBP pulse frequency less than about 800 kHz.

Figure 8:
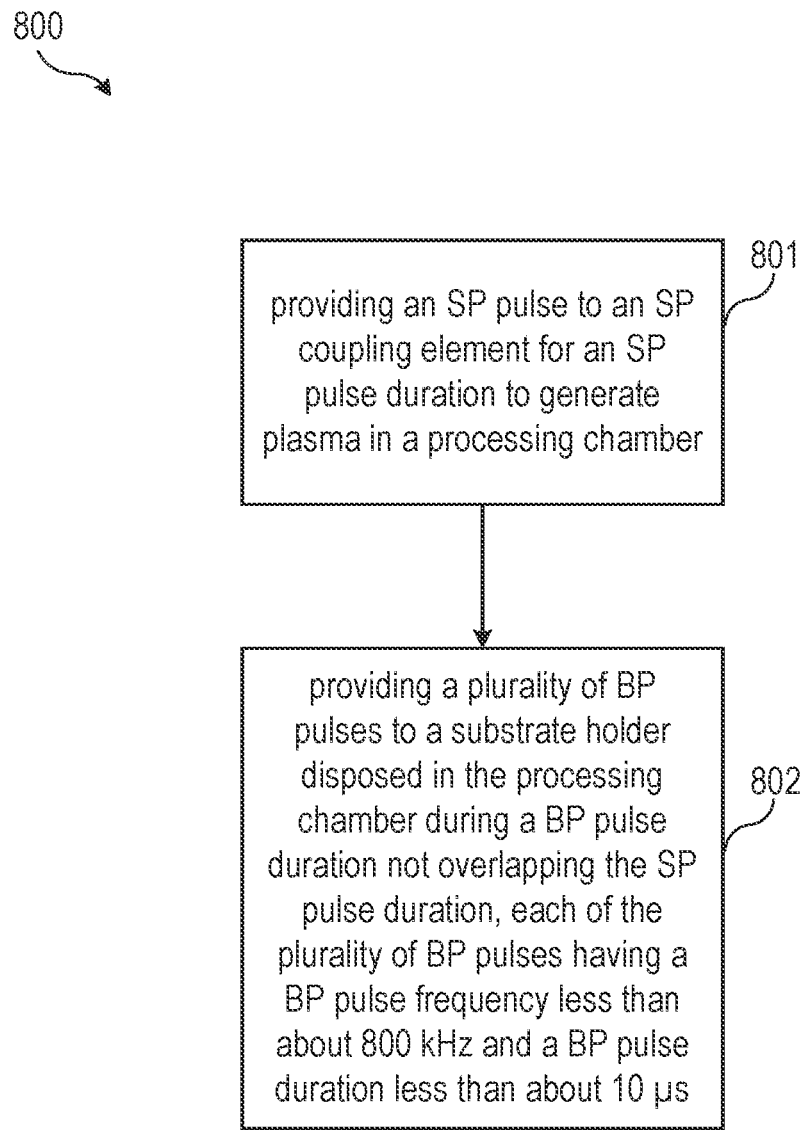
FIG. 8 illustrates another example plasma processing method in accordance with an embodiment of the invention.

FIG. 8 illustrates another example plasma processing method in accordance with an embodiment of the invention. The plasma processing method of FIG. 8 may be performed using embodiment schematic timing diagrams and embodiment plasma processing systems and apparatuses as described herein. For example, the plasma processing method of FIG. 8 may be combined with any of the embodiments of FIGS. 1-6. Further, the plasma processing method of FIG. 8 is not intended to be mutually exclusive with other plasma processing methods described herein. For example, the plasma processing method of FIG. 8 may be combined with the plasma processing method of FIG. 8. The below method steps may be performed in any suitable order as may be apparent to a person of skill in the art.

Referring to FIG. 8, step 801 of a plasma processing method 800 includes providing an SP pulse to an SP coupling element for an SP pulse duration to generate plasma in a processing chamber. Step 802 includes providing a plurality of BP pulses to a substrate holder disposed in the processing chamber during a BP pulse duration that does not overlap the SP pulse duration. Each of the plurality of BP pulses have a BP pulse frequency less than about 800 kHz and a BP pulse duration less than about 10 μs.

Example embodiments of the invention are summarized here. Other embodiments can also be understood from the entirety of the specification as well as the claims filed herein.

Example 1. A plasma processing method including: providing a first source power (SP) pulse to an SP coupling element for a first SP pulse duration to generate plasma in a processing chamber; providing a high frequency bias power (HBP) pulse to a substrate holder disposed in the processing chamber for an HBP pulse duration overlapping the first SP pulse duration, the HBP pulse including an HBP pulse frequency greater than 800 kHz; and providing a first low frequency bias power (LBP) pulse to the substrate holder for a first LBP pulse duration not overlapping the first SP pulse duration, the first LBP pulse including an LBP pulse frequency less than about 800 kHz.

Example 2. The plasma processing method of example 1, where the HBP pulse duration fully overlaps both the first SP pulse duration and the first LBP pulse duration.

Example 3. The plasma processing method of example 1, where the HBP pulse duration fully overlaps and is equal to the first SP pulse duration.

Example 4. The plasma processing method of one of examples 1 to 3, further including: after the first SP pulse duration, providing a second SP pulse to the SP coupling element for a second SP pulse duration overlapping the first LBP pulse duration; where the first SP pulse includes a first SP pulse power; and where the second SP pulse includes a second SP pulse power less than the first SP pulse power.

Example 5. The plasma processing method of one of examples 1 to 4, where the first SP pulse duration is about 20 μs, and where the first LBP pulse duration is about 80 μs.

Example 6. The plasma processing method of one of examples 1 to 5, further including: after the first LBP pulse duration, providing a second SP pulse to the SP coupling element for a second SP pulse duration; and providing a second LBP pulse to the substrate holder for a second LBP pulse duration not overlapping the second SP pulse duration.

Example 7. The plasma processing method of example 6, further including: after the first LBP pulse duration, providing no SP to the SP coupling electrode and no LBP to the substrate holder for a delay duration; and where the second SP pulse is provided after the delay duration.

Example 8. The plasma processing method of example 7, where: the HBP pulse duration fully overlaps the first SP pulse duration, the first LBP pulse duration, and at least partially overlaps the delay duration; and the HBP pulse includes an HBP power that is less than an LBP pulse power of the first LBP pulse.

Example 9. A plasma processing method including: providing a first source power (SP) pulse to an SP coupling element for a first SP pulse duration to generate plasma in a processing chamber; and providing a plurality of bias power (BP) pulses to a substrate holder disposed in the processing chamber during a first BP pulse duration not overlapping the first SP pulse duration, each of the plurality of BP pulses including a BP pulse frequency less than about 800 kHz and a BP pulse duration less than about 10 µs.

Example 10. The plasma processing method of example 9, further including: providing a high frequency bias power (HBP) pulse to the substrate holder for a second BP pulse duration overlapping the SP pulse duration, the HBP pulse including a frequency greater than 800 kHz.

Example 11. The plasma processing method of example 10, where the second BP pulse duration fully overlaps and is equal to the SP pulse duration.

Example 12. The plasma processing method of one of examples 9 to 11, further including: after the first BP pulse duration, providing a second SP pulse to the SP coupling element for a second SP pulse duration; and providing a second plurality of BP pulses to the substrate holder for a second BP pulse duration not overlapping the second SP pulse duration.

Example 13. The plasma processing method of one of examples 9 to 12, where each of the plurality of BP pulses is a single direct current (DC) pulse.

Example 14. The plasma processing method of example 13, where a portion of the plurality of BP pulses are positive DC pulses, and where the remaining portion of the plurality of BP pulses are negative DC pulses.

Example 15. The plasma processing method of one of examples 9 to 14, where each of the plurality of BP pulses includes a BP pulse duration less than about 1 µs.

Example 16. A plasma processing apparatus, including: a processing chamber; a source power (SP) coupling element configured to generate plasma in the processing chamber; an SP power supply node coupled to the SP coupling element and configured to supply radio frequency (RF) power to the SP coupling element; a substrate holder disposed in the processing chamber; a first bias power (BP) supply node coupled to the substrate holder and configured to supply first direct current (DC) biased power to the substrate holder, the first DC biased power including a first BP frequency less than about 800 kHz; and a second BP supply node coupled to the substrate holder and configured to supply second DC biased power to the substrate holder, the second DC biased power including a second BP frequency greater than 800 kHz.

Example 17. The plasma processing apparatus of example 16, where the first BP frequency is about 400 kHz.

Example 18. The plasma processing apparatus of one of examples 16 and 17, where the second BP frequency is about 13 MHz.

Example 19. The plasma processing apparatus of one of examples 16 to 18, where: the SP coupling element is a helical resonator disposed outside the processing chamber and configured to generate an inductively coupled plasma in the processing chamber; and the RF power includes an RF power frequency equal to about 27 MHz.

Example 20. The plasma processing apparatus of one of examples 16 to 19, where: the first BP supply node and the second BP supply node are configured to concurrently supply the first DC biased power and the second DC biased power to the substrate holder.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A plasma processing apparatus comprising:
   a processing chamber;
   a source power (SP) coupling element configured to generate plasma in the processing chamber;
   an SP supply node coupled to the SP coupling element and configured to supply radio frequency (RF) power to the SP coupling element;
   a substrate holder disposed in the processing chamber;
   a first bias power (BP) supply node coupled to the substrate holder and configured to supply first direct current (DC) biased alternating current (AC) power to the substrate holder, the first DC biased AC power comprising a first BP frequency less than about 800 kHz; and
   a second BP supply node coupled to the substrate holder and configured to supply second DC biased AC power to the substrate holder, the second DC biased AC power comprising a second BP frequency greater than 800 kHz.

2. The plasma processing apparatus of claim 1, wherein the first BP frequency is about 400 kHz.

3. The plasma processing apparatus of claim 2, wherein the second BP frequency is about 13 MHz.

4. The plasma processing apparatus of claim 3, wherein:
   the SP coupling element is a helical resonator disposed outside the processing chamber and configured to generate an inductively coupled plasma in the processing chamber; and
   the RF power comprises an RF power frequency equal to about 27 MHz.

5. The plasma processing apparatus of claim 1, wherein:
   the first BP supply node and the second BP supply node are configured to concurrently supply the first DC biased AC power and the second DC biased AC power to the substrate holder.

6. The plasma processing apparatus of claim 1, wherein the first BP frequency is greater than 0 Hz.

7. The plasma processing apparatus of claim 1, wherein:
   the SP supply node is further configured to supply the RF power as an SP pulse for an SP pulse duration;
   the first BP supply node is further configured to supply the first DC biased AC power as a low frequency bias power (LBP) pulse for an LBP duration not overlapping the SP pulse duration; and the second BP supply node is further configured to supply the second DC biased AC power as a high frequency bias power (HBP) pulse for an HBP pulse duration overlapping at least a portion of the SP pulse duration.

8. A plasma processing apparatus comprising:
a processing chamber;
a source power (SP) coupling element configured to generate plasma in the processing chamber;
an SP supply node coupled to the SP coupling element and configured to supply an SP pulse to the SP coupling element for an SP pulse duration to generate the plasma;
a substrate holder disposed in the processing chamber; and
a low frequency bias power (LBP) supply node coupled to the substrate holder and configured to supply a plurality of alternating current (AC) bias power (BP) pulses to the substrate holder for an LBP pulse duration not overlapping the SP pulse duration, each of the plurality of AC BP pulses comprising a BP pulse frequency less than about 800 kHz and a BP pulse duration less than about 10 µs.

9. The plasma processing apparatus of claim 8, further comprising:
a high frequency bias power (HBP) supply node coupled to the substrate holder and configured to supply an HBP pulse to the substrate holder for an HBP pulse duration overlapping the SP pulse duration, the HBP pulse comprising an HBP frequency greater than 800 kHz.

10. The plasma processing apparatus of claim 9, wherein:
the LBP supply node and the HBP supply node are configured to concurrently supply DC biased AC power to the substrate holder.

11. The plasma processing apparatus of claim 9, wherein the HBP frequency is about 13 MHz.

12. The plasma processing apparatus of claim 8, wherein a portion of the plurality of AC BP pulses are positive DC biased pulses, and wherein a remaining portion of the plurality of AC BP pulses are negative DC biased pulses.

13. The plasma processing apparatus of claim 8, wherein each of the plurality of AC BP pulses comprises a BP pulse duration less than about 1 µs.

14. The plasma processing apparatus of claim 8, wherein:
the SP coupling element is a helical resonator disposed outside the processing chamber and configured to generate an inductively coupled plasma in the processing chamber; and
the SP pulse comprises RF power comprising an RF power frequency equal to about 27 MHz.

15. A plasma processing apparatus comprising:
a processing chamber;
a source power (SP) coupling element configured to generate plasma in the processing chamber;
an SP supply node coupled to the SP coupling element and configured to supply radio frequency (RF) power as an SP pulse to the SP coupling element for an SP pulse duration;
a substrate holder disposed in the processing chamber;
a first BP supply node coupled to the substrate holder and configured to supply first direct current (DC) biased alternating current (AC) power as a low frequency bias power (LBP) pulse to the substrate holder for an LBP duration not overlapping the SP pulse duration, the first DC biased AC power comprising a first BP frequency less than about 800 kHz and greater than 0 Hz; and
a second bias power (BP) supply node coupled to the substrate holder and configured to supply second DC biased AC power as a high frequency bias power (HBP) pulse to the substrate holder for an HBP pulse duration overlapping at least a portion of the SP pulse duration, the second DC biased AC power comprising a second BP frequency greater than 800 kHz.

16. The plasma processing apparatus of claim 15, wherein the first BP frequency is about 400 kHz.

17. The plasma processing apparatus of claim 16, wherein the second BP frequency is about 13 MHz.

18. The plasma processing apparatus of claim 17, wherein:
the SP coupling element is a helical resonator disposed outside the processing chamber and configured to generate an inductively coupled plasma in the processing chamber; and
the RF power comprises an RF power frequency equal to about 27 MHz.

19. The plasma processing apparatus of claim 15, wherein:
the first BP supply node and the second BP supply node are configured to concurrently supply the first DC biased AC power and the second DC biased AC power to the substrate holder.

20. The plasma processing apparatus of claim 7, wherein each LBP duration of each LBP pulse supplied by the first BP supply node is less than about 1 us.

* * * * *